United States Patent [19]
Broekaert

[11] Patent Number: 6,100,723
[45] Date of Patent: Aug. 8, 2000

[54] HIGH-SPEED DIFFERENTIAL COMPARATOR

[75] Inventor: Tom P. E. Broekaert, Dallas, Tex.

[73] Assignee: Texas Instruments Incorporated, Dallas, Tex.

[21] Appl. No.: 09/226,028

[22] Filed: Jan. 6, 1999

Related U.S. Application Data

[60] Provisional application No. 60/070,552, Jan. 6, 1998.

[51] Int. Cl.[7] .............................. H03K 5/22; H03K 5/153
[52] U.S. Cl. .............................. 327/77; 327/80; 327/195; 327/570
[58] Field of Search .................................. 327/63, 65, 77, 327/78, 80, 81, 82, 88, 89, 195, 309, 321, 326, 499, 870

[56] References Cited

U.S. PATENT DOCUMENTS

| | | | |
|---|---|---|---|
| 5,140,188 | 8/1992 | Burns | 327/78 |
| 5,699,010 | 12/1997 | Hatanaka | 327/563 |
| 5,973,561 | 10/1999 | Heaton | 330/252 |

OTHER PUBLICATIONS

Dr. Tom Broekaert, et al., "Low Jitter 25 GHz Clock Generator for Analog–to–Digital Converters", Raytheon TI Systems, Aug. 20, 1997, pp. 1–8.
Dr. Tom Broekaert, "Ultrahigh Speed Resonant Tunneling Diode/Transmission Line Clock Generator and Track–and–Hold", 1997 IEEE Cornell Conference, pp. 1–7.
Ruai Y. Ya, et al., "A Traveling–Wave Resonant Tunnel Diode Pulse Generator", 1994 IEEE, pp. 220–222.
Junji Kawat, et al., "Analysis of Chua's Circuit with Transmission Line", 1996 IEEE, pp. 201–204.
Long Yang, et al., "A 50 GHz Broad–Band Monolithic GaAs/AlAs Resonant Tunneling Diode Trigger Circuit", 1994 IEEE, pp. 585–595.
A.C. Molnar, et al., "Submm–wave Monolithic RTD Oscillator Arrays to 650 GHz", IEDM 1996, pp. 940–942.
A. Miura, et al., "Monolithic Sampling Head IC with Resonant Tunneling Diode for Strobe Pulse Generator on InP Substrate", IEDM 89, pp. 899–901.
E. Özbay, et al., "110–GHz Monolithic Resonant–Tunneling–Diode Trigger Circuit", 1991 IEEE, pp. 480–482.

*Primary Examiner*—Terry D. Cunningham
*Assistant Examiner*—Quan Tru
*Attorney, Agent, or Firm*—Wade James Brady, III; Frederick J. Telecky, Jr.

[57] ABSTRACT

A high-speed differential comparator (300) is disclosed. A transconductance device is connected to the input terminal and the first and second output terminals (305 and 309, respectively) of the comparator. The transconductance device receives an input voltage ($V_{IN}$) from the input terminal and generates a current between the first and second output terminals (305 and 309) in response to the input voltage. A load is connected between the first and second output terminals. The load, which includes a resonant tunneling diode (313), conducts the current and generates a voltage difference between the first and second output terminals (305 and 309) in response to the current. The comparator responds to input voltages at high speed and may be used for high frequency signal sampling and level determination.

19 Claims, 4 Drawing Sheets

HIGH-SPEED DIFFERENTIAL COMPARATOR

This application claims priority under 35 USC §119(e)(1) of provisional application No. 60/070,552 filed Jan. 6, 1998.

RELATED APPLICATIONS

This application is related to a provisional application entitled "High-Speed Differential Comparator," filed Jan. 6, 1999, having a Ser. No. of 09/225,961, and an attorney docket number of TI-25915.

TECHNICAL FIELD OF THE INVENTION

This invention relates generally to the field of analog signal processing and more particularly to a high-speed differential comparator.

BACKGROUND OF THE INVENTION

In the field of analog signal processing, the use of comparators to determine a signal level is well known. Typically, such comparators have been limited in their response time due to the circuit components making up the comparators. As a result, high-speed and/or high-frequency voltage level comparison has not been possible.

SUMMARY OF THE INVENTION

Therefore, a need has arisen for a high-speed comparator that addresses the disadvantages and deficiencies of the prior art.

A high-speed differential comparator is disclosed. In one embodiment, the comparator comprises an input terminal and first and second output terminals. A transconductance device is connected to the input terminal and the first and second output terminals. The transconductance device receives an input voltage from the input terminal and generates a current between the first and second output terminals in response to the input voltage. A load is connected between the first and second output terminals. The load, which includes a resonant tunneling diode, conducts the current and generates a voltage difference between the first and second output terminals in response to the current.

A technical advantage of the present invention is that the comparator responds to input voltages at high speed. Another technical advantage is that a signal level determination circuit utilizing the comparator may be used for high frequency signal sampling.

BRIEF DESCRIPTION OF THE DRAWINGS

For a more complete understanding of the present invention and for further features and advantages thereof, reference is now made to the following description taken in conjunction with the accompanying drawings, in which.

DETAILED DESCRIPTION OF THE INVENTION

Figure 1:
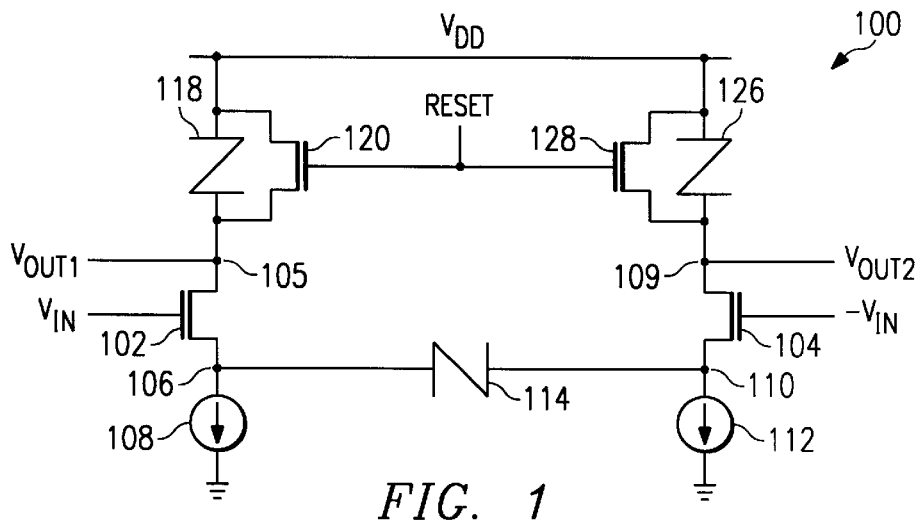
FIG. 1 is a schematic diagram of a differential comparator circuit constructed in accordance with one embodiment of the present invention.

Referring to FIG. 1, a differential comparator circuit 100 is shown. In this circuit, an input voltage $V_{IN}$ is received at the gate of a first field effect transistor (FET) 102. The inverse of $V_{IN}$ ($-V_{IN}$) is supplied to the gate of a second FET 104. Alternatively, a reference voltage $V_{REF}$ may be supplied to the gate of FET 104.

FET 102 has a drain connected to an output node 105 and a source connected to node 106. A current sink 108 is connected between node 106 and ground. FET 104 has a drain connected to a second output node 109 and a source connected to node 110. A current sink 112 matched to current sink 108 is connected between node 110 and ground. Current sinks 108 and 112 each sink a current I. A resonant tunneling diode 114 is connected between nodes 106 and 110.

A resonant tunneling diode 118 is connected between a voltage supply $V_{DD}$ and output node 105. A reset FET 120 is connected between $V_{DD}$ and output node 105, in parallel with RTD 118. Reset FET 120 receives a RESET signal at its gate to reset the output voltage $V_{OUT1}$ at output node 105.

Likewise, a resonant tunneling diode 126 is connected between $V_{DD}$ and output node 109. A second reset FET 128 is connected between $V_{DD}$ and output node 109, in parallel with RTD 126. Reset FET 128 receives the RESET signal at its gate to reset the output voltage $V_{OUT2}$ at output node 109.

In operation, differential comparator circuit 100 alternates between a comparison cycle and a reset cycle. During the comparison cycle, FETs 102 and 104 conduct a combined current of 2I. When the input voltages supplied to the gates of FETs 102 and 104 are equal, FETs 102 and 104 each conduct a current I equal to the current conducted by each current sink 108 and 112. If the voltage supplied to the gate of FET 104 is $-V_{IN}$, then this occurs when $V_{IN}=-V_{IN}=0$. If the voltage supplied to the gate of FET 104 is $V_{REF}$, then this occurs when $V_{IN}=V_{REF}$. In either case, this is known as the equilibrium value of $V_{IN}$.

When $V_{IN}$ is above its equilibrium value, FET 102 will conduct a current I+ε and FET 104 will conduct a current I−ε. Conversely, when $V_{IN}$ is more negative than its equilibrium value, FET 102 will conduct a current I−ε and FET 104 will conduct a current I+ε. The value of ε varies from zero to I, depending on the magnitude of the departure of $V_{IN}$ from its equilibrium value. A current equal to ε is conducted by RTD 114 to compensate for the difference in current conducted by FETs 102 and 104. RTD 114 functions merely as a resistance between nodes 106 and 110, and does not utilize the characteristics unique to resonant tunneling diodes. RTD 114 may therefore be replaced by a resistor.

During the comparison cycle, the RESET signal is low, and FETs 120 and 128 act as open switches. Thus, the current conducted by FET 102 is also conducted by RTD 118. Likewise, the current conducted by FET 104 is also conducted by RTD 126.

Figure 2:
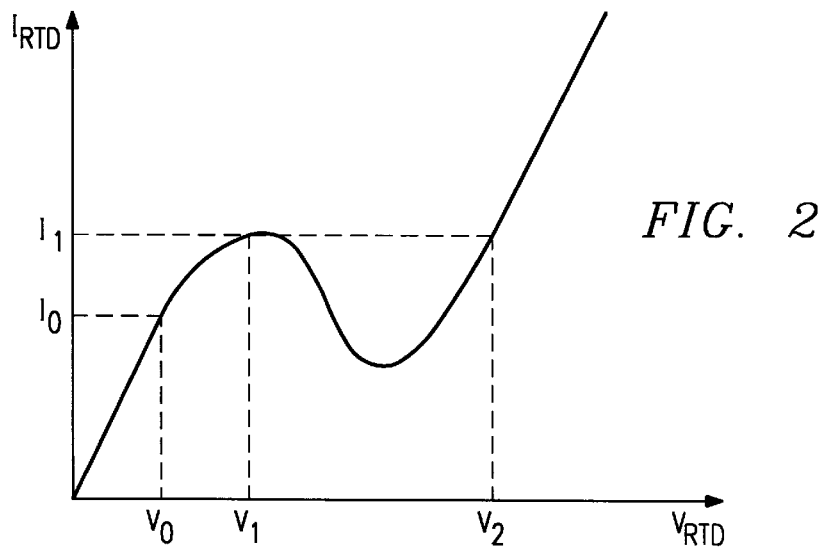
FIG. 2 is a graph of voltage versus current for an exemplary resonant tunneling diode.

The voltage drop $V_{RTD1}$, or $V_{RTD2}$ across each respective RTD 118 and 126 varies with the current conducted by the RTD as shown in FIG. 2. Thus, when the input voltage $V_{IN}$ is at its equilibrium value, each RTD conducts an equilibrium current $I_0$ which creates a voltage drop $V_0$ across the RTD. When the RTD current reaches a transition value $I_1$, the voltage drop across the RTD transitions discontinuously from $V_1$ to $V_2$.

FIG. 2 shows the current-voltage profile only for a forward-biased RTD. However, it will be understood in the following description that where an RTD may be biased in either direction, as with RTD 114, a symmetric or nearly symmetric RTD is preferably used. Alternatively, a symmetric RTD arrangement such as that illustrated in FIG. 4 may be used, as will be explained more fully below. For RTDs which are only biased in one direction, such as RTDs 118 and 126, symmetry need not be a consideration.

The voltage drop across RTD 118 results in an output voltage $V_{OUT1}=V_{DD}-V_{RTD1}$ at output node 105. Thus, for example, if $V_{IN}>-V_{IN}$ and $I+\epsilon<I_1$, then $V_{RTD1}<V_1$ and $V_{OUT1}>V_{DD}-V_1$. However, if $V_{IN}>-V_{IN}$ and $I+\epsilon>I_1$, then $V_{RTD1}>V_2$ and $V_{OUT1}<V_{DD}-V_2$. In other words, when the input voltage $V_{IN}$ crosses a certain positive threshold value ($V_{T+}$), the first output voltage $V_{OUT1}$ transitions discontinuously from $V_{DD}-V_1$ to $V_{DD}-V_2$, while the second output voltage $V_{OUT2}$ remains above $V_{DD}-V_1$.

Likewise, if $V_{IN}<-V_{IN}$ and $I+\epsilon<I_1$, then $V_{RTD2}<V_1$ and $V_{OUT2}>V_{DD}-V_1$. However, if $V_{IN}<-V_{IN}$ and $I+\epsilon>I_1$, then $V_{RTD2}>V_2$ and $V_{OUT2}<V_{DD}-V_2$. In other words, when the input voltage $V_{IN}$ reaches a certain negative threshold value ($V_{T-}$), the second output voltage $V_{OUT2}$ transitions discontinuously from $V_{DD}-V_1$ to $V_{DD}-V_2$, while the first output voltage $V_{OUT2}$ remains above $V_{DD}-V_1$.

Figure 3:
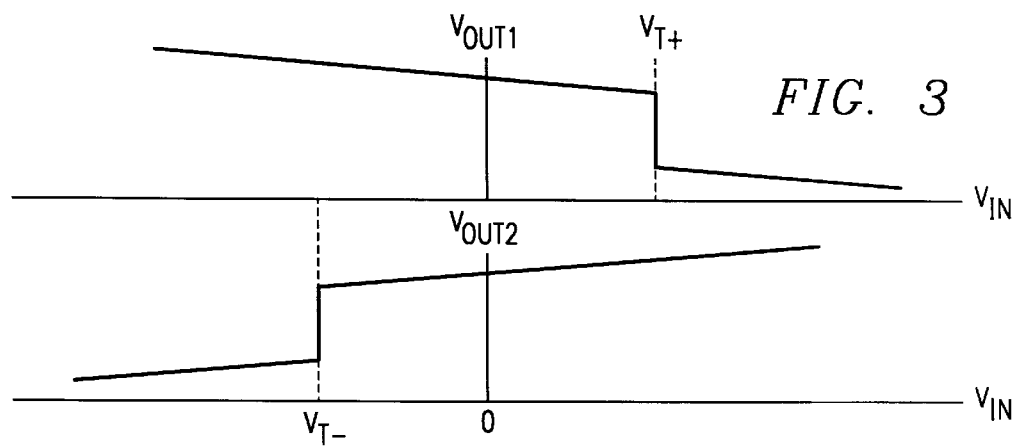
FIG. 3 is a graph illustrating the output characteristics of the differential comparator circuit.

These exemplary output characteristics of differential comparator circuit 100 are illustrated in FIG. 3. It will be recognized that if differential comparator circuit 100 is completely symmetrical, then $V_{T+}=-V_{T-}$. It will also be recognized that, in the alternative embodiment in which the gate voltage of FET 104 is kept at a reference voltage $V_{REF}$ rather than $-V_{IN}$, similar output characteristics will be observed, but with the horizontal axes of FIG. 3 being centered on $V_{REF}$ rather than zero.

Differential comparator circuit 100 therefore acts as a threshold detector with three valid output states:

(1) If $V_{OUT1}$=HIGH and $V_{OUT2}$=HIGH, then $V_{T-}<V_{IN}<V_{T+}$.

(2) If $V_{OUT1}$=LOW and $V_{OUT2}$=HIGH, then $V_{IN}>V_{T+}$.

(3) If $V_{OUT1}$=HIGH and $V_{OUT2}$=LOW, then $V_{IN}<V_{T-}$.

In these output states HIGH represents a voltage greater than or equal to $V_{DD}-V_1$, whereas LOW represents a voltage less than or equal to $V_{DD}-V_2$.

During the reset cycle of differential comparator circuit 100, the RESET signal is high. FETs 120 and 128 therefore act as closed switches, shorting the output nodes 105 and 109 to $V_{DD}$. Periodic resetting of differential comparator circuit 100 is beneficial because of the hysteresis introduced into differential comparator circuit 100 by RTDs 118 and 126. If either output voltage $V_{OUT1}$ or $V_{OUT2}$ assumes a LOW value, then the aforementioned output states of differential comparator circuit 100 may not properly indicate the value of the input voltage until the circuit is reset. Thus, the RESET signal may be, for example, a clock signal with a frequency of up to 25 GHz or even higher.

Figure 4:
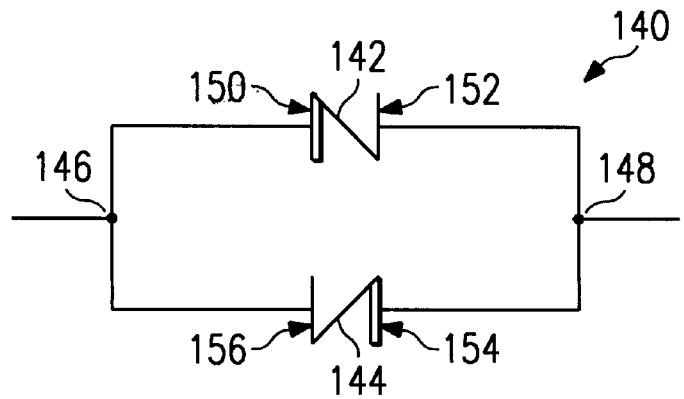
FIG. 4 is a schematic diagram of a symmetrical resonant tunneling diode arrangement that improves the symmetry of the differential comparator circuit.

Referring to FIG. 4, a symmetrical RTD arrangement 140 that may be used to improve the symmetry of differential comparator circuit 100 is shown. It is well known that a resonant tunneling diode exhibits a slight asymmetry in its V-I curve, depending on the direction in which current is flowing through the RTD. In symmetrical RTD arrangement 140, two resonant tunneling diode 142 and 144 are connected in parallel between first and second nodes 146 and 148. RTD 142 has a first side 150 connected to node 146 and a second side 152 connected to node 148. First side 150 represents the substrate side of RTD 142. Likewise, RTD 144 has a first side 154, representing the substrate side of RTD 144, connected to node 148. A second side 156 is connected to node 146. Symmetrical RTD arrangement 140 exhibits a symmetrical V-I response curve. Symmetrical RTD arrangement 140 may be substituted for RTD 114 in differential comparator circuit 100 to improve the output symmetry of the circuit.

Figure 5:
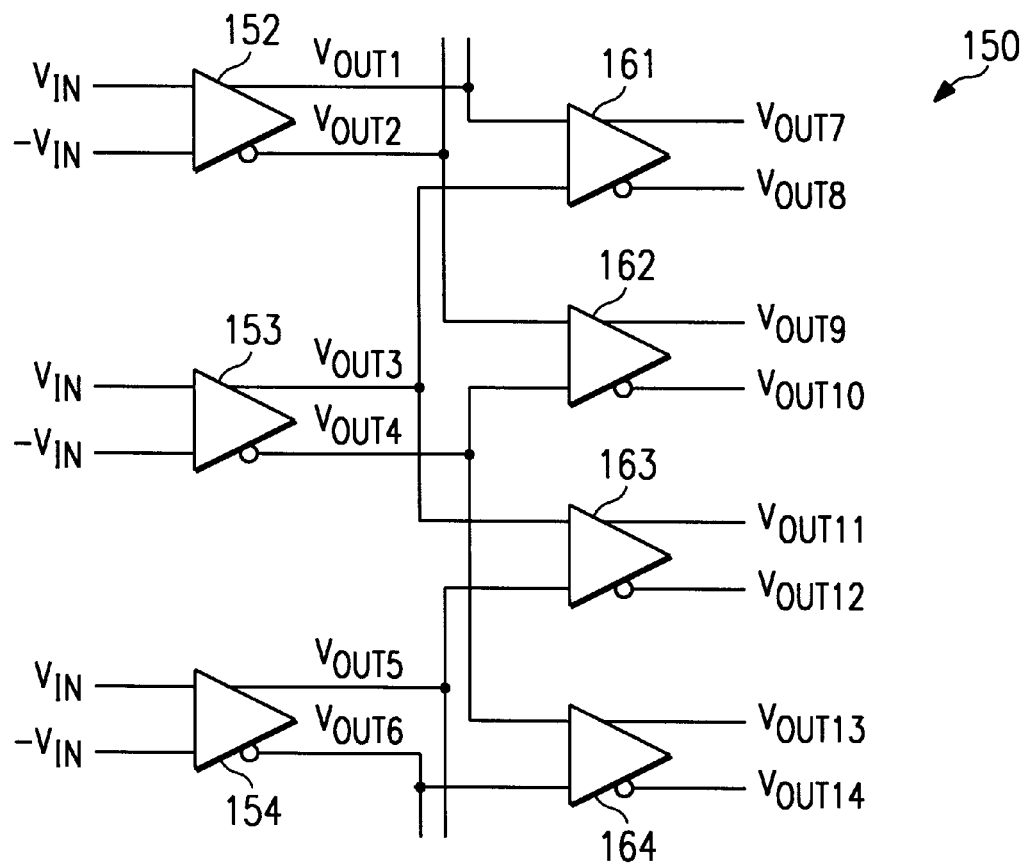
FIG. 5 is a schematic diagram in partial block form of a signal level determination circuit utilizing the differential comparator circuit.

Referring to FIG. 5, a signal level determination circuit 150 utilizing differential comparator circuit 100 is shown. Signal level determination circuit 150 includes a set of primary differential comparators such as comparators 152–154. Each primary differential comparator 152–154 receives an input voltage ($V_{IN}$) and its inverse ($-V_{IN}$) and generates an output at two output terminals. Each primary differential comparator may comprise a differential comparator circuit such as differential comparator circuit 100, or any other embodiment of the present invention described below. Each primary differential comparator receives a RESET signal (not shown), which is preferably a clock signal with a frequency equal to the desired sampling frequency for input voltage $V_{IN}$.

For illustrative purposes, only three primary differential comparators are shown. However, it will be understood that any number of primary differential comparators may be included in signal level determination circuit 150.

The various outputs of primary differential comparators 152–154 are received by a set of secondary differential comparators 161–164 in a manner described more fully below. Each secondary differential comparator also receives the same RESET signal received by primary differential comparators 152–154. Each secondary differential comparator generates two outputs in response to the inputs.

Again, the number of secondary differential comparators shown is for illustrative purposes only, and it will be understood that any number of secondary differential comparators may be included in signal level determination circuit 150. Generally, the number of secondary differential comparators will be approximately equal to the number of primary differential comparators, in accordance with the connection scheme described below.

Taking primary differential comparator 153 as an example, this comparator has a first output $V_{OUT3}$ which is supplied to a first input of secondary differential comparator 163 and a second input of secondary differential comparator 161. Primary differential comparator 153 has a second output $V_{OUT4}$ which is supplied to a first input of secondary differential comparator 164 and a second input of secondary differential comparator 162.

This pattern continues throughout signal level determination circuit 150. Thus, each primary differential comparator N has a first output supplied to a first input of a corresponding secondary differential comparator n. The first output of primary differential comparator N is also supplied to a second input of secondary differential comparator n-2. The second output of primary differential comparator N is supplied to a first input of secondary differential comparator n+1 and a second input of secondary differential comparator n−1.

In this arrangement, each secondary differential comparator n, when n is odd, receives a first input from the first output of primary differential comparator N and receives a second input from the first output of primary differential comparator N+1. When n is even, secondary differential comparator n receives a first input from the second output of primary differential comparator N and a second input from the second output of primary differential comparator N+1.

Figure 6:
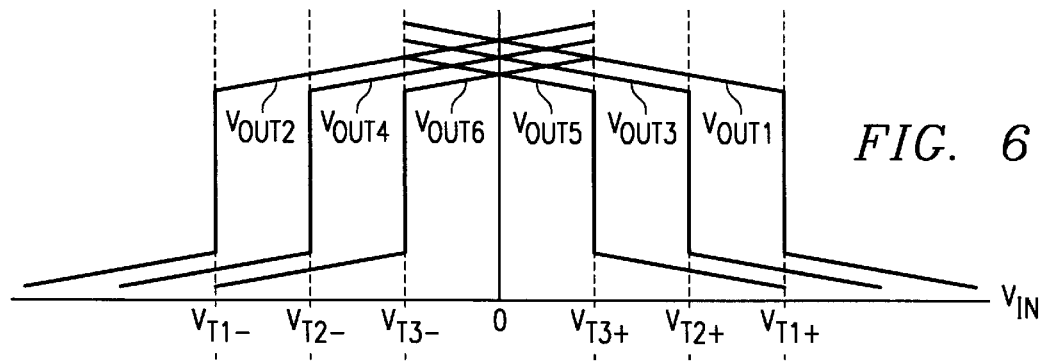
FIGS. 6 and 7 are graphs illustrating the output of the signal level determination circuit.
Figure 7:
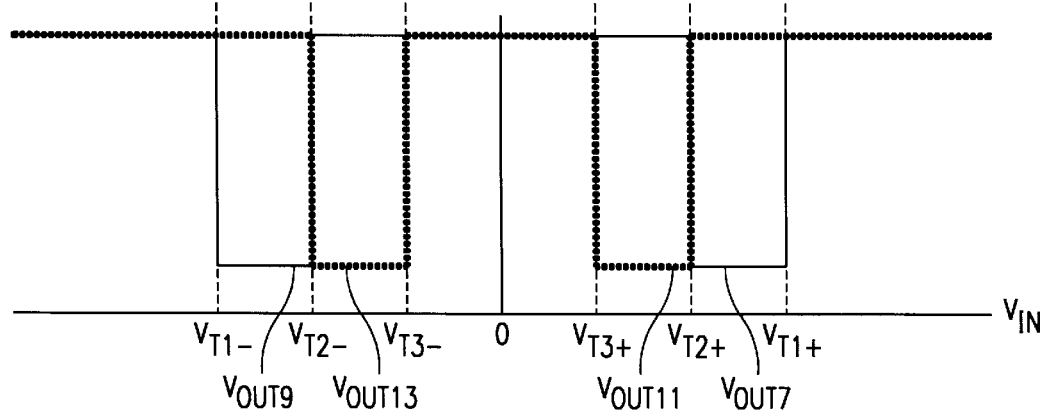

The output generated by signal level determination circuit 150 is shown in FIGS. 6 and 7. Referring first to FIG. 6, when the input voltage $V_{IN}$ rises above a threshold voltage $V_{T1+}$, the first output voltage $V_{OUT1}$ of primary differential comparator 152 changes from HIGH to LOW, while the second output voltage $V_{OUT2}$ remains HIGH. When the input voltage $V_{IN}$ drops below a the inverse threshold voltage $V_{T1-}$, the second output voltage $V_{OUT2}$ of primary differential comparator 152 changes from HIGH to LOW, while the first output voltage $V_{OUT1}$ remains HIGH.

Likewise, primary differential comparators 153 and 154 each have their own positive threshold voltages $V_{T2+}$ and $V_{T3+}$, respectively, and their own negative threshold voltages $V_{T2-}$ and $V_{T3-}$, respectively. The components of primary differential comparators 152–154 may be adjusted so that the respective threshold voltages are separated by regular intervals such as, for example, 100 millivolts. This separation interval determines the resolution of signal level determination circuit 150, as will become apparent from the description below. Thus, signal level determination circuit 150 should have primary differential comparators with threshold voltages evenly spaced throughout the desired detection range of input voltage $V_{IN}$.

Referring to FIG. 7, the output of secondary differential comparators 161–164 is shown. Taking secondary differential comparator 163 as an example, this comparator receives as its input the output voltage $V_{OUT3}$ from primary differential comparator 153 and the output voltage $V_{OUT5}$ from primary differential comparator 154.

When the input voltage $V_{IN}$ is less than $V_{T3+}$, both $V_{OUT3}$ and $V_{OUT5}$ are HIGH. With its two inputs at approximately the same level, secondary differential comparator 163 is at or near equilibrium, and both its outputs $V_{OUT11}$ and $V_{OUT12}$ are HIGH.

When the input voltage $V_{IN}$ is between $V_{T3+}$ and $V_{T2+}$, $V_{OUT3}$ remains HIGH while $V_{OUT5}$ is LOW. This disparity in inputs causes $V_{OUT11}$ to become LOW, while $V_{OUT12}$ remains HIGH.

When the input voltage $V_{IN}$ is greater than $V_{T2+}$, both $V_{OUT3}$ and $V_{OUT5}$ are LOW. With its two inputs at approximately the same level, secondary differential comparator 163 is at or near equilibrium, and both its outputs $V_{OUT11}$ and $V_{OUT12}$ are HIGH.

Thus, output voltage $V_{OUT11}$ indicates whether the input voltage $V_{IN}$ is between $V_{T2+}$ and $V_{T3+}$. Likewise, output voltage $V_{OUT7}$ from secondary differential comparator 161 indicates whether the input voltage $V_{IN}$ is between $V_{T1+}$ and $V_{T2+}$.

As another example, secondary differential comparator 162 receives as its input the output voltage $V_{OUT2}$ from primary differential comparator 152 and the output voltage $V_{OUT4}$ from primary differential comparator 153. Referring to FIG. 6, it may be seen that these inputs are disparate when the input voltage $V_{IN}$ is between $V_{T1-}$ and $V_{T2-}$. Thus, in this input voltage range, output voltage $V_{OUT9}$ is LOW. For all other input voltage values, $V_{OUT9}$ is HIGH.

Thus, output voltage $V_{OUT9}$ indicates whether the input voltage $V_{IN}$ is between $V_{T1-}$ and $V_{T2-}$. Likewise, output voltage $V_{OUT13}$ from secondary differential comparator 164 indicates whether the input voltage $V_{IN}$ is between $V_{T2-}$ and $V_{T3-}$.

The outputs of secondary differential comparators 161–164 may therefore be used to determine the magnitude and polarity of input voltage $V_{IN}$. With enough primary and secondary differential comparators, signal level determination circuit 150 may be used to detect the input voltage level with any desired resolution. Moreover, because each differential comparator in signal level determination circuit 150 responds to its input at high speed, the circuit may provide signal level detection with a high sampling frequency. The sampling frequency of signal level determination circuit 150 is determined by the frequency of the RESET signal used in the circuit. Given the short response time of the individual comparators, the sampling frequency may be as high as 25 GHz or even higher.

Figure 8:
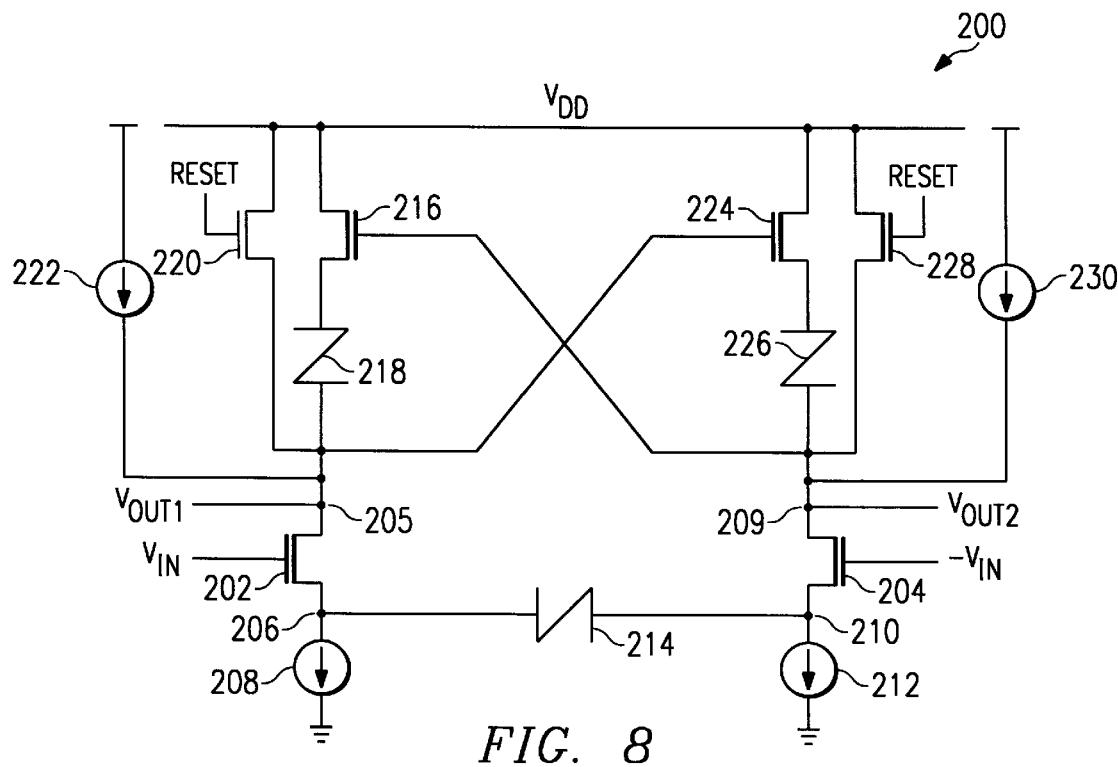
FIG. 8 is a schematic diagram of a differential comparator circuit constructed in accordance with another embodiment of the present invention.

Referring to FIG. 8, a second differential comparator circuit 200 similar to differential comparator circuit 100 is shown. An input voltage $V_{IN}$ is received at the gate of a first FET 202. The inverse of $V_{IN}$ ($-V_{IN}$) is supplied to the gate of a second FET 204. Alternatively, a reference voltage $V_{REF}$ may be supplied to the gate of FET 204.

FET 202 has a drain connected to an output node 205 and a source connected to node 206. A current sink 208 is connected between node 206 and ground. FET 204 has a drain connected to a second output node 209 and a source connected to node 210. A current sink 212 matched to current sink 208 is connected between node 210 and ground. Current sinks 208 and 212 each sink the same current. A resonant tunneling diode 214 is connected between nodes 206 and 210. Alternatively, RTD 214 may be replaced by symmetrical RTD arrangement 140 shown in FIG. 4, as previously described, to improve the symmetry of differential comparator circuit 200.

A first load FET 216 and a resonant tunneling diode 218 are connected in series between a voltage supply $V_{DD}$ and output node 205. A reset FET 220 is connected between $V_{DD}$ and output node 205, in parallel with load FET 216 and RTD 218. Reset FET 220 receives a RESET signal at its gate to reset the output voltage $V_{OUT1}$ at output node 205. A current source 222 supplies a current to output node 205.

Likewise, a second load FET 224 and a resonant tunneling diode 226 are connected in series between $V_{DD}$ and output node 209. A second reset FET 228 is connected between $V_{DD}$ and output node 209, in parallel with load FET 224 and RTD 226. Reset FET 228 receives the RESET signal at its gate to reset the output voltage $V_{OUT2}$ at output node 209. A current source 230 supplies a current to output node 209.

Differential comparator circuit 200 is similar in design to differential comparator circuit 100 and exhibits similar output characteristics. One difference between the two circuits is the presence of current sources 222 and 230 in differential comparator circuit 200. Current sources 222 and 230 preferably supply identical currents to FETs 202 and 204, respectively. This current is preferably less than or equal to the current conducted by current sinks 208 and 212. As a result, each RTD 218 or 226 conducts a current equal to the difference between the current conducted by the respective FET 202 or 204 and the current sourced by the respective current source 222 or 230. Thus, it will be appreciated that the current generated by current sources 222 and 230 determines the threshold voltages $V_{T-}$ and $V_{T+}$ of differential comparator circuit 200.

Another difference between differential comparator circuit 200 and differential comparator circuit 100 is the presence of load FETs 216 and 224. The gate of load FET 216 is connected to output node 209, while the gate of load FET 224 is connected to output node 205. This arrangement produces larger output swings at output nodes 105 and 109.

Figure 9:
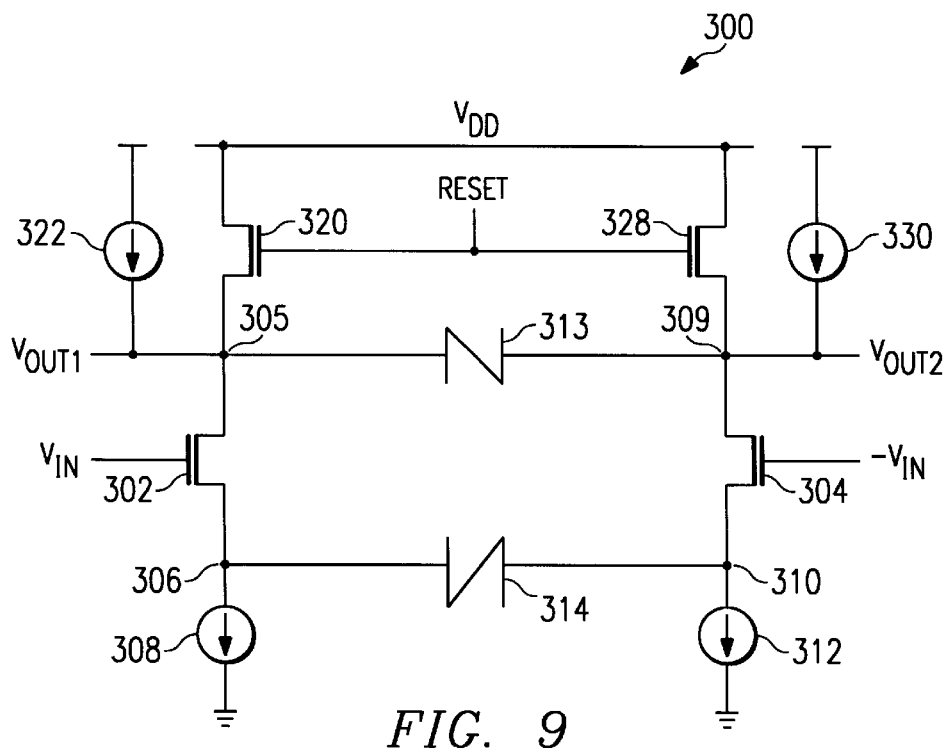
FIG. 9 is a schematic diagram of a differential comparator circuit constructed in accordance with yet another embodiment of the present invention.

Referring to FIG. 9, a third differential comparator circuit 300 similar to differential comparator circuits 100 and 200 is shown. In this circuit, an input voltage $V_{IN}$ is received at the gate of a first FET 302. The inverse of $V_{IN}$ is supplied to the gate of a second FET 304. Alternatively, a reference voltage $V_{REF}$ may be supplied to the gate of FET 304.

FET 302 has a drain connected to an output node 305 and a source connected to node 306. A current sink 308 is connected between node 306 and ground. FET 304 has a drain connected to a second output node 309 and a source connected to node 310. A current sink 312 matched to current sink 308 is connected between node 310 and ground. Current sinks 308 and 312 each sink a current I.

A resonant tunneling diode 313 is connected between output nodes 305 and 309. Another resonant tunneling diode 314 is connected between nodes 306 and 310. Alternatively, RTD 314 may be replaced by symmetrical RTD arrangement 140 shown in FIG. 4, as previously described, to improve the symmetry of differential comparator circuit 300.

A reset FET 320 is connected between a voltage supply $V_{DD}$ and output node 305. Likewise, a second reset FET 328 is connected between $V_{DD}$ and output node 309. Reset FETs 320 and 328 receive a RESET signal at their respective gates to reset the output voltages $V_{OUT1}$ and $V_{OUT2}$ at output nodes 305 and 309, respectively.

In operation, differential comparator circuit 300 functions in a manner similar to differential comparator circuits 100 and 200. During a comparison cycle, the RESET signal is low and reset FETs 320 and 328 are off, thus isolating output nodes 305 and 309 from $V_{DD}$. Current sinks 308 and 312 each sink a current I. FETs 302 and 304 each conduct a current I±ϵ for a total current of 2I. RTD 314 therefore conducts a current ϵ which is less than or equal to I. Current sources 322 and 330 each supply a current I to output nodes 305 and 309, respectively. Thus, RTD 313 also conducts a current ϵ.

Referring again to FIG. 2, when the current through RTD 313 reaches a transition value $I_1$, the voltage drop across RTD 313 ($V_{RTD}$) transitions discontinuously from $V_1$ to $V_2$. The voltage drop across RTD 313 results in a voltage difference between output nodes 305 and 309. Thus, for example, if $V_{IN} > -V_{IN}$ and $\epsilon < I_1$, then $V_{RTD} = V_{OUT2} - V_{OUT1} < V_1$. However, if $V_{IN} > -V_{IN}$ and $\epsilon > I_1$, then $V_{RTD} = V_{OUT2} - V_{OUT1} > V_2$. In other words, when the input voltage $V_{IN}$ crosses a certain positive threshold value ($V_{T+}$), the differential output voltage $V_{OUT1} - V_{OUT2}$ transitions discontinuously from $-V_1$ to $-V_2$.

Likewise, if $V_{IN} < -V_{IN}$ and $\epsilon < I_1$, then $V_{RTD} = V_{OUT1} - V_{OUT2} < V_1$. However, if $V_{IN} < -V_{IN}$ and $\epsilon > I_1$, then $V_{RTD} = V_{OUT1} - V_{OUT2} > V_2$. In other words, when the input voltage $V_{IN}$ reaches a certain negative threshold value ($V_{T-}$), the differential output voltage $V_{OUT1} - V_{OUT2}$ transitions discontinuously from $V_1$ to $V_2$.

Differential comparator circuit 300 therefore acts as a threshold detector with three output states:

(1) If $V_{OUT1} - V_{OUT2} \geq V_2$, then $V_{IN} < V_{T-}$.
(2) If $V_1 \geq V_{OUT1} - V_{OUT2} \geq -V_1$, then $V_{T-} < V_{IN} < V_{T+}$.
(3) If $V_{OUT1} - V_{OUT2} \leq -V_2$, then $V_{IN} > V_{T+}$.

Figure 10:
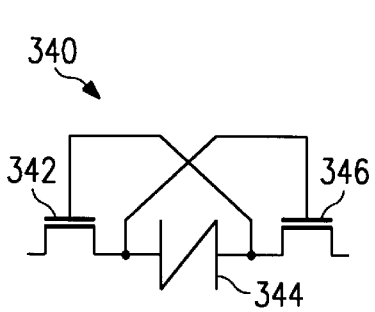
FIG. 10 is an alternative load configuration that may be used with the differential comparator circuit.

Referring to FIG. 10, a load configuration 340 that may be substituted for RTD 313 is shown. Load configuration 340 comprises a FET 342 with a drain connected to output node 305 of differential comparator circuit 300. The source of FET 342 is connected to a resonant tunneling diode 344. A second FET 346 has a drain connected to output node 309 of differential comparator circuit 300 and a source connected to RTD 344. The gate of FET 342 is connected to the source of FET 346, and vice versa. This load configuration produces larger output swings than RTD 313 alone can provide.

Figure 11:
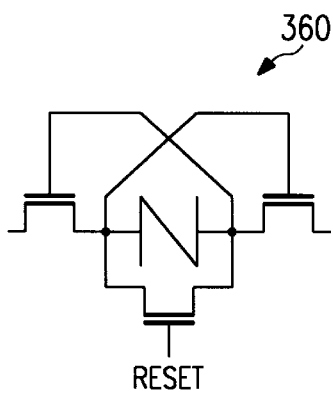
FIG. 11 is another alternative load configuration that may be used with the differential comparator circuit.

Referring to FIG. 11, a load configuration 350 that may be substituted for RTD 313 and reset FETs 320 and 328 is shown. In this configuration, reset FETs 320 and 328 are removed, leaving output nodes 305 and 309 decoupled from $V_{DD}$ even during the reset cycle of differential comparator circuit 300. A resonant tunneling diode 352 is connected between output nodes 305 and 309. A reset FET 354 is also connected between output nodes 305 and 309, in parallel with RTD 352. During the reset cycle of differential comparator circuit 300, the RESET signal is high. Reset FET 354 therefore acts as a closed switch, equalizing output nodes 305 and 309.

Figure 12:
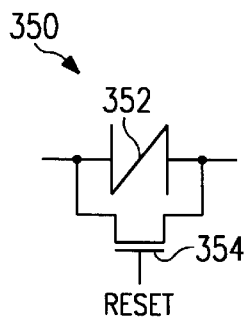
FIG. 12 is yet another alternative load configuration that may be used with the differential comparator circuit.

Referring to FIG. 12, a load configuration 360 combining the aspects of configurations 340 and 350 is shown. Load configuration 360 is connected between output nodes 305 and 309 of differential comparator circuit 300 in place of RTD 313 and reset FETs 320 and 328. The operation of load configuration 360 will be apparent to those skilled in the art in light of the previous descriptions of configurations 340 and 350.

While the invention has been particularly shown and described by the foregoing detailed description, it will be understood by those skilled in the art that various other changes in form and detail may be made without departing from the spirit and scope of the invention.

What is claimed is:

1. A comparator comprising:
   an input terminal;
   first and second output terminals;
   a transconductance device connected to the input terminal and the first and second output terminals, the transconductance device being operable to receive an input voltage from the input terminal and generate a current between the first and second output terminals in response to the input voltage; and
   a load connected between the first and second output terminals, the load having a resonant tunneling diode, the load being operable to conduct the current and generate a voltage difference between the first and second output terminals in response to the current.

2. The comparator of claim 1, wherein the transconductance device comprises:
   a current sink;
   a first transistor having first, second and third terminals, the first terminal being operable to receive the first input voltage, the second terminal being coupled to the current sink, the third terminal being coupled to the first output terminal; and
   a second transistor having first, second and third terminals, the first terminal being operable to receive the second input voltage, the second terminal being coupled to the current sink, the third terminal being coupled to the first output terminal.

3. The comparator of claim 2, wherein the transconductance device further comprises:
   a first current source operable to supply a first offset current to the first output terminal, the first offset current offsetting at least a portion of the first current; and
   a second current source operable to supply a second offset current to the second output terminal, the second offset current offsetting at least a portion of the second current.

4. The comparator of claim 2, wherein the current sink comprises:
   a first current sink coupled to the second terminal of the first transistor;
   a second current sink coupled to the second terminal of the second transistor; and
   an impedance connected between the second terminal of the first transistor and the second terminal of the second transistor.

5. The comparator of claim 4, wherein the impedance comprises a resonant tunneling diode.

6. The comparator of claim 4, wherein the impedance comprises:
   a first resonant tunneling diode connected between the second terminal of the first transistor and the second terminal of the second transistor in a first orientation;
   a second resonant tunneling diode connected between the second terminal of the first transistor and the second terminal of the second transistor in a second orientation, the second orientation being opposite to the first orientation.

7. The comparator of claim 1, further comprising a reset device operable to receive a reset signal and eliminate the voltage difference between the first and second output terminals in response to the reset signal.

8. The comparator of claim 7, wherein the reset device comprises:
   a first reset switch connected between a voltage supply and the first output terminal, the first reset switch being operable to close in response to the reset signal; and
   a second reset switch connected between the voltage supply and the second output terminal, the second reset switch being operable to close in response to the reset signal.

9. The comparator of claim 7, wherein the reset device comprises a reset switch connected between the first and second output terminals, the reset switch being operable to close in response to the reset signal.

10. A signal level determination circuit comprising a plurality of comparators, each comparator being operable to receive an input voltage and generate an output voltage in response to the input voltage, at least one of the comparators having:
    an input terminal;
    first and second output terminals;
    a transconductance device connected to the input terminal and the first and second output terminals, the transconductance device being operable to receive an input voltage from the input terminal and generate a current between the first and second output terminals in response to the input voltage; and
    a load connected between the first and second output terminals, the load having a resonant tunneling diode, the load being operable to conduct the current and generate a voltage difference between the first and second output terminals in response to the current.

11. The signal level determination circuit of claim 10, wherein the transconductance device comprises:
    a current sink;
    a first transistor having first, second and third terminals, the first terminal being operable to receive the first input voltage, the second terminal being coupled to the current sink, the third terminal being coupled to the first output terminal; and
    a second transistor having first, second and third terminals, the first terminal being operable to receive the second input voltage, the second terminal being coupled to the current sink, the third terminal being coupled to the first output terminal.

12. The signal level determination circuit of claim 11, wherein the transconductance device further comprises:
    a first current source operable to supply a first offset current to the first output terminal, the first offset current offsetting at least a portion of the first current; and
    a second current source operable to supply a second offset current to the second output terminal, the second offset current offsetting at least a portion of the second current.

13. The signal level determination circuit of claim 11, wherein the current sink comprises:
    a first current sink coupled to the second terminal of the first transistor;
    a second current sink coupled to the second terminal of the second transistor; and
    an impedance connected between the second terminal of the first transistor and the second terminal of the second transistor.

14. The signal level determination circuit of claim 13, wherein the impedance comprises a resonant tunneling diode.

15. The signal level determination circuit of claim 13, wherein the impedance comprises:
    a first resonant tunneling diode connected between the second terminal of the first transistor and the second terminal of the second transistor in a first orientation; and
    a second resonant tunneling diode connected between the second terminal of the first transistor and the second terminal of the second transistor in a second orientation, the second orientation being opposite to the first orientation.

16. The signal level determination circuit of claim 10, wherein the comparator further comprises a reset device operable to receive a reset signal and eliminate the voltage difference between the first and second output terminals in response to the reset signal.

17. The signal level determination circuit of claim 16, wherein the reset device comprises:
    a first reset switch connected between a voltage supply and the first output terminal, the first reset switch being operable to close in response to the reset signal; and
    a second reset switch connected between the voltage supply and the second output terminal, the second reset switch being operable to close in response to the reset signal.

18. The signal level determination circuit of claim 16, wherein the reset device comprises a reset switch connected between the first and second output terminals, the reset switch being operable to close in response to the reset signal.

19. A method for detecting a voltage level, comprising the steps of:
    receiving at a transconductance device first and second input voltages;
    generating by the transconductance device a current across a load in response to the first and second input voltages, the load including a resonant tunneling diode; and
    generating a differential output voltage by the load in response to the current generated across the load.

* * * * *